(12) United States Patent
Turgeon

(10) Patent No.: US 9,046,581 B2
(45) Date of Patent: Jun. 2, 2015

(54) SUPERVISOR MONITORING SYSTEM

(75) Inventor: Thomas Joseph Turgeon, Riverview, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 634 days.

(21) Appl. No.: 13/337,493

(22) Filed: Dec. 27, 2011

(65) Prior Publication Data

US 2013/0166244 A1 Jun. 27, 2013

(51) Int. Cl.
*G06F 19/00* (2011.01)
*G01N 27/416* (2006.01)
*G01R 31/36* (2006.01)
*H01M 10/44* (2006.01)
*H01M 10/42* (2006.01)
*G05B 23/02* (2006.01)

(52) U.S. Cl.
CPC .......... *G01R 31/3627* (2013.01); *H01M 10/44* (2013.01); *G01R 31/3658* (2013.01); *H01M 10/4285* (2013.01); *G05B 23/0237* (2013.01)

(58) Field of Classification Search
CPC .......... G01R 31/3627; G01R 31/3658; G05B 19/418; G05B 23/00; H01M 10/44; H01M 10/4285; Y02E 60/12
USPC ................. 702/117, 118, 119, 120, 185, 188; 324/426, 429, 434, 536; 714/25; 715/700
See application file for complete search history.

(56) References Cited

U.S. PATENT DOCUMENTS

| | | | | |
|---|---|---|---|---|
| 5,861,882 | A * | 1/1999 | Sprenger et al. | 715/700 |
| 7,707,458 | B2 * | 4/2010 | Miller et al. | 714/25 |
| 7,728,597 | B2 | 6/2010 | Bertness | |
| 2010/0188091 | A1 | 7/2010 | Vonderhaar et al. | |

FOREIGN PATENT DOCUMENTS

CN 20101102766 1/2010

* cited by examiner

*Primary Examiner* — John H Le
(74) *Attorney, Agent, or Firm* — Maristyn Law LLC; Lynda Kouroupis; David B. Kelley

(57) ABSTRACT

A supervisor monitoring system for autonomous test supervision is presented. A system can include a first supervisor monitor (SM) and a second SM, each configured to simultaneously monitor one or more tests conducted by one or more testing apparatus. First and second SMs can be configured to verify the other's integrity throughout a testing procedure, providing a failsafe system. The first and second SMs can be interlocked so that if the first SM detects a fault at the second SM, the first SM can interrupt testing monitored at the first SM, and can also interrupt testing monitored at the second SM, and vice versa. An SM can be configured to control a safety relay configured to couple a power channel of a battery exerciser to a battery cell, and be configured to monitor input at the battery exerciser from the cell to determine whether a test constraint has been violated.

21 Claims, 12 Drawing Sheets

SUPERVISOR MONITORING SYSTEM

FIELD OF INVENTION

This invention relates generally to battery testing, and more specifically to systems for monitoring the battery testing process.

BACKGROUND OF INVENTION

Battery performance is an important factor in the operation and reliability of consumer devices, apparatus and vehicles. Battery testing, particularly that conducted with batteries incorporating advanced technology, is an important stage of the battery development process. Typically, battery testing procedures require battery exercising equipment to charge and discharge battery cells in accordance with predetermined test profiles designed to simulate various operating conditions. The testing apparatus measures and records cell characteristics during the charging exercises so that battery performance can be evaluated.

Unfortunately, problems at the devices under test and/or faults at the testing equipment can occur during the battery testing process. Typically, an operator can specify test constraints for the cells being tested, for example, an operator can designate upper and/or lower voltage and temperature limits. Should cell characteristics violate the test constraints, exercising of the battery cells can be terminated. However, testing equipment can malfunction, sensors or probes may fail, and processing errors can occur. In such cases, the test equipment may fail to detect that cell environmental characteristics are beyond test limit specifications. Consequently, testing procedures are conducted under human supervision so that an operator can intervene if something goes awry.

Even with sophisticated multi-channel testing equipment, battery cell testing can be a lengthy and time-consuming process. For example, testing of electrochemical cells for a hybrid electric vehicle (HEV) high-voltage battery can require testing 24 hours/day for multiple days, far exceeding the 8-hour work day of a typical test operator. As a result, a test is often commenced at the beginning of an operator work shift, interrupted when a shift is completed, and then resumed on a subsequent shift. Performed at this type of pace, a single test can require weeks, or perhaps months to complete. In addition to prolonging the length of time necessary to conduct the test, intermittent starting and stopping of the charging and discharging processes can introduce rest periods and transient effects that can skew results and lead to inaccurate conclusions regarding cell and battery performance.

SUMMARY OF INVENTION

A supervisor monitoring system can autonomously supervise tests conducted by a testing apparatus, allowing test procedures to be performed safely without human supervision. In an example embodiment, the supervisor monitoring system can be used to supervise battery cell testing by a battery cycling apparatus. Because a system can be configured to supervise battery testing performed continuously over multiple days, it can safely eliminate the intermittent starts and stops of operator-dependent systems. Continuous testing can not only reduce the testing period but can also yield more accurate results. An example system can include a first supervisor monitor (SM) configured to monitor testing of a first device under test (DUT) by a first testing apparatus (TA), and a second SM configured to verify the integrity of the first SM. A supervisor monitoring system can be configured to automatically interrupt testing by a testing apparatus in response to a trigger event. By way of example, but not limitation, a trigger event can comprise a violation of a predetermined test constraint, or a fault at one of the supervisor monitors. The first SM can be configured to verify the integrity of the second SM so that the integrity of both can be confirmed throughout a supervised testing procedure to provide a fail-safe system. The first and second SMs can be interlocked, enabling either to interrupt testing monitored by the other should a fault be detected at either SM. In an example embodiment, each SM can monitor testing by a plurality of testing apparatus.

An example supervisor monitor can include a user interface module, a test control module, a signal acquisition module, an integrity module, an interlock module, and a processing module. The user interface module can be configured to receive one or more test constraints for one or more individual tests monitored by the supervisor monitor. In an example embodiment, the user interface module can be configured to receive test constraints for a plurality of tests conducted by a plurality of testing apparatus. The test control module can be configured to control a power connection between the testing apparatus and a DUT. The test control module can enable the connection to allow testing, and disable the power connection to stop or interrupt testing. In an exemplary embodiment, the test control module is configured to control a safety relay that couples a power channel of a testing apparatus to a DUT. The signal acquisition module (SAM) can be configured to monitor input at a testing apparatus. For example, via an overlay harness analog signals associated with a DUT that are input at a TA can be provided to the SAM. An integrity module can be configured to enable a supervisor monitor to cooperate with a remote supervisor monitor of a supervisor monitoring system to ensure that both first and second supervisor monitors are functioning properly throughout the testing process. An interlock module can be configured to provide each supervisor monitor of a supervisor system control over testing monitored by the other. For example, the interlock module can be configured to enable a first supervisor monitor to interrupt testing monitored by a second supervisor monitor should an SM fault be detected. In an example embodiment, a supervisor monitor can further include a processing module configured to perform various processing and control operations, such as comparing TA input to a predetermined test constraint, executing software, and coordinating operations of various supervisor monitor modules.

An example method of the invention can include receiving a predetermined test constraint, and controlling a power connection between a testing apparatus and a device-under-test. In an example method, controlling a power connection between a testing apparatus and a device under test can comprise enabling the power connection, determining whether a trigger event has occurred, and disabling the power connection in response to a trigger event. A trigger event can include, but not be limited to, a violation of a predetermined test constraint, or a fault at an SM An example method can include receiving test constraints for a plurality of tests conducted by a plurality of test apparatus and controlling a plurality of power connections.

BRIEF DESCRIPTION OF THE SEVERAL DRAWINGS

FIG. 1 shows an example supervisory system.
FIG. 2 shows an example supervisory system.
FIG. 3 depicts an example supervisory system.
FIG. 4 depicts an example supervisor monitor.
FIG. 5 depicts an example user interface screen.

DETAILED DESCRIPTION OF EXAMPLE EMBODIMENTS

Example embodiments of the invention are presented herein; however, the invention may be embodied in a variety of alternative forms, as will be apparent to those skilled in the art. To facilitate understanding of the invention, and provide a basis for the claims, various figures are included in the specification. The figures may not be drawn to scale and related elements may be omitted so as to emphasize the novel features of the invention. Structural and functional details depicted in the figures are provided for the purpose of teaching the practice of the invention to those skilled in the art and are not to be interpreted as limitations. For example, modules for various systems can be variously arranged and/or combined and may not be depicted in illustrations of example embodiments herein in order to better emphasize novel aspects of the invention. In addition, system components can be variously arranged or configured as known in the art.

Figure 1:
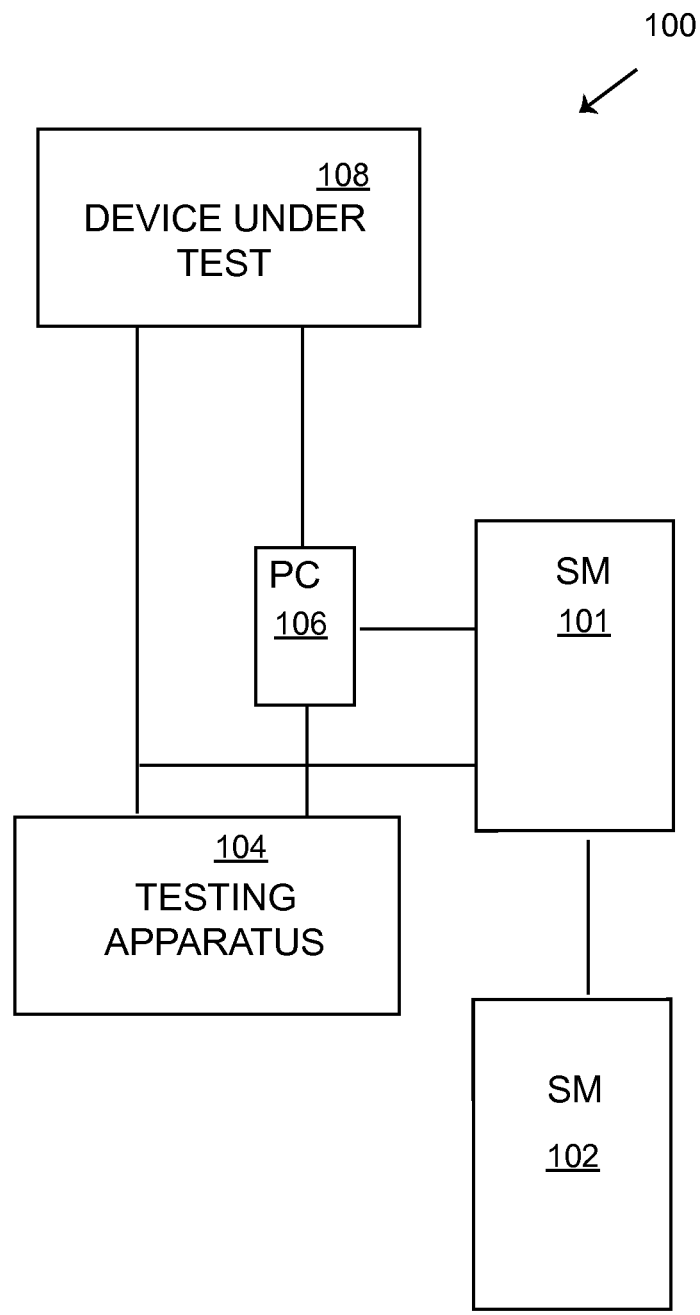

FIG. 1 shows an example embodiment 100 in which a first supervisor monitor (SM) 101 and a second SM 102 are configured to cooperate to supervise testing by a testing apparatus (TA) 104 of a device under test (DUT) 108. The SM 101 can be configured to monitor input at the TA 104 and control a power connection 106 between the TA 104 and the DUT 108. In an example embodiment, the power connection 106 can be implemented by a safety relay. The SM 101 can be configured to close the relay to allow testing by the TA 104, and open the relay, disconnecting the DUT 108 from the TA 104 power channel, should a trigger event occur.

In an exemplary embodiment, each SM of a supervisor monitor system can be configured to verify the integrity of the other SM with which it is cooperating. Accordingly, the SM 101 can be configured to verify the integrity of the SM 102, and the SM 102 can be configured to verify the integrity of the SM 101. The SM 101 and SM 102 can be interlocked so that the SM 102 can interrupt testing conducted by the TA 104. In an exemplary system, the TA 104 can be embodied as a battery cycler, such as the Arbin Instruments™ battery cycler such as the Hybrid Vehicle Testing System (HEVBT) model or the Battery Testing System (BT2000), and the DUT 108 can be in the form of one or more electrochemical cells, for example one or more HEV battery cells. For ease of reference herein, the first SM 101 can be referred to as a primary SM with respect to itself and the TA 104 because the SM 101 is monitoring TA 104 testing, for example by monitoring input at the TA 104. The SM 102 can be referred to as a remote or secondary SM with respect to the SM 101 and TA 104.

Figure 2:
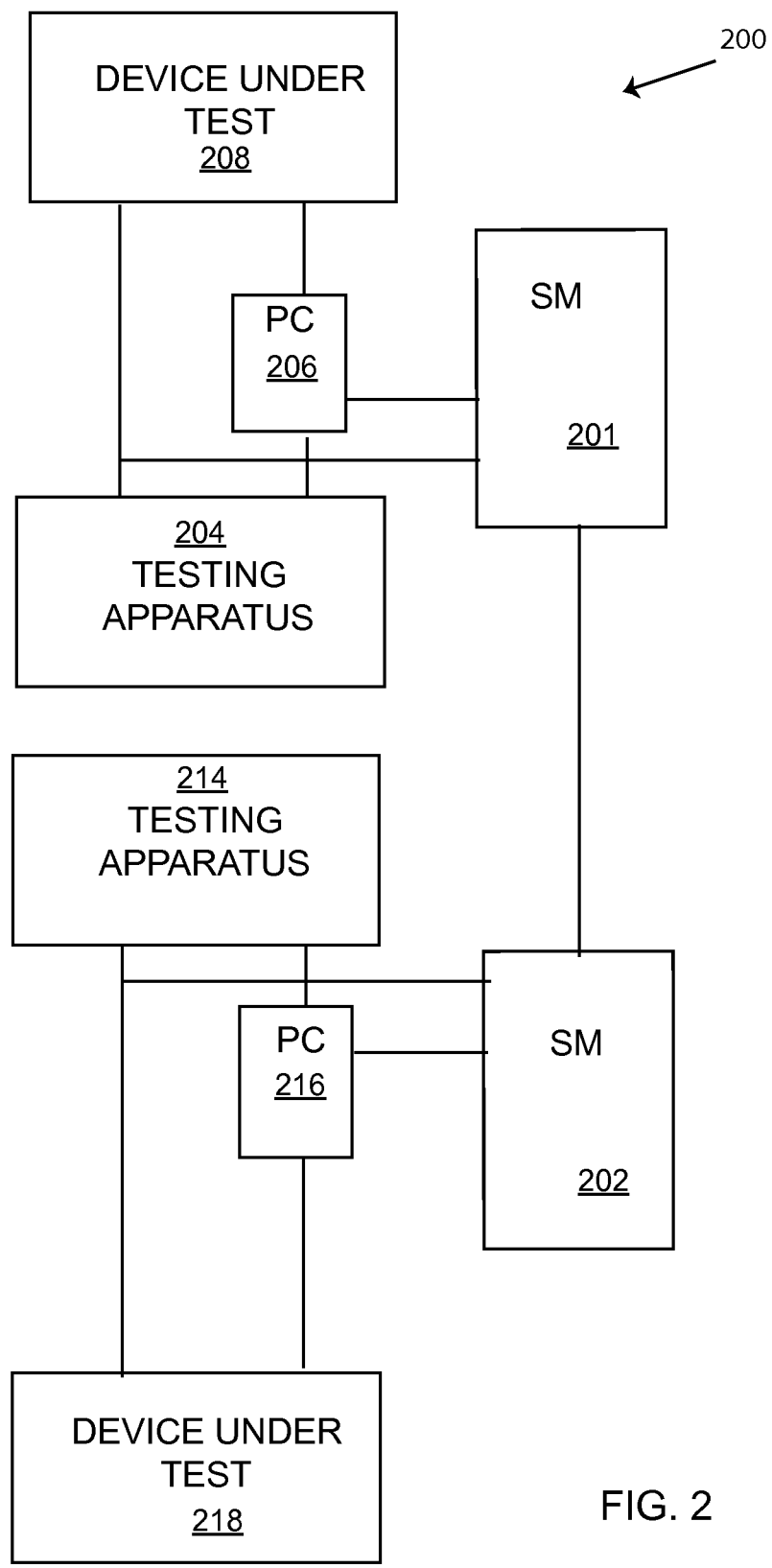

FIG. 2 shows an example embodiment 200, in which two SMs cooperate to supervise testing of separate DUTs, namely DUT 208, 218, by separate testing apparatus, namely TA 204, 214. In an example embodiment, each of the TAs 204, 214 is in the form of a battery exerciser, and each of the DUTs 208,218 is in the form of an electrochemical cell. The TA 201 can be configured to monitor testing by the TA 204 by monitoring input at the TA 204. The SM 201 can be configured to determine whether input at the TA 204 violates a predetermined test constraint, for example whether a cell voltage or temperature exceeds a predetermined maximum. The SM 201 can be configured to disable the power connection 206 should a violation occur, thereby interrupting the charging or discharging of the DUT 208. In an example embodiment, the power connection 206 is in the form of a safety relay that can be powered on or powered off by the SM 201.

In like manner, the SM 202 can be configured to monitor input at the TA 214 from the DUT 218. The SM 202 can be configured to determine whether input at the TA 214 violates a predetermined test constraint, for example whether a cell voltage or temperature exceeds a predetermined maximum. The SM 202 can be configured to disable the power connection 216 should a violation occur, thereby interrupting the charging or discharging of the DUT 218. In an example embodiment, the power connection 216 is in the form of a safety relay that can be powered on or powered off by the SM 202.

The SM 201 can be configured to verify the integrity of the SM 202, and the SM 202 can be configured to verify the integrity of the SM 201. The two supervisor monitors SM 201 and SM 202 can be interlocked so that either can interrupt testing monitored by the other should it detect a fault at the other. Accordingly, the SM 201 can interrupt testing monitored by the SM 202; i.e. testing performed by the TA 214, should it detect a fault at the SM 202. Likewise, the SM 202 can interrupt testing monitored by the SM 201; i.e. testing conducted by the TA 204, should it detect a fault at the SM 201.

Figure 3:
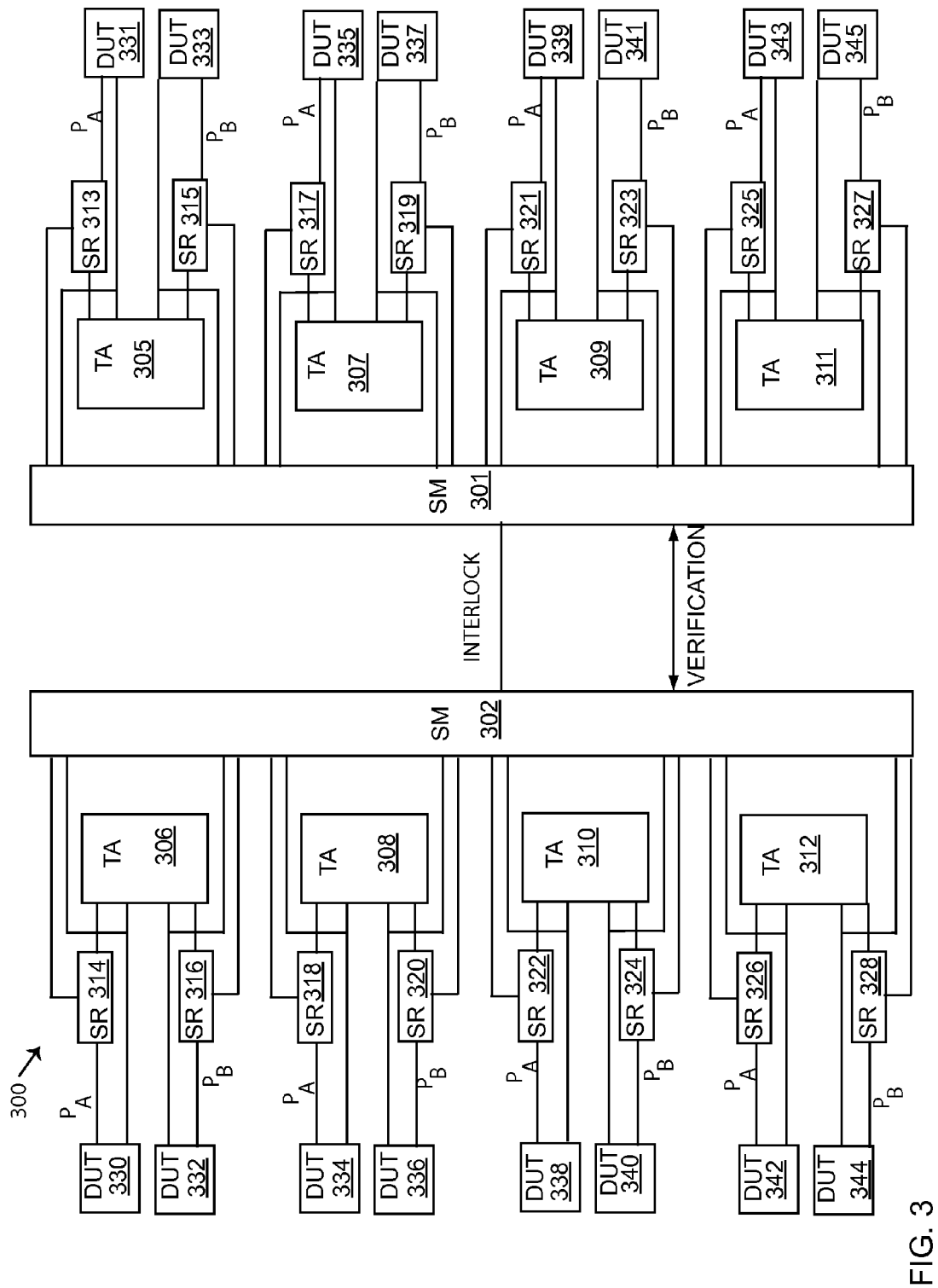

FIG. 3 shows an example embodiment 300 in which a supervisor monitor is configured to monitor testing by a plurality of multi-channeled testing apparatus. An SM 301 can be configured to monitor testing by TA 305, TA 307, TA 309 and TA 311, each of which can be configured with two power channels, PA, PB, that can be used to charge or discharge a device under test, in this example DUTs 331, 333, 335, 337, 339, 341, 343 and 345 respectively. The SM 301 can be configured to control power connections between the identified TAs and DUTs. By way of example, the SM 301 can be configured to control a safety relay SR 313 that couples a TA 305 power channel A, PA, and the DUT 331, and to control a safety relay SR 315 that couples a TA 305 power channel B, PB, and the DUT 333. Because the SM 301 is configured to monitor testing by the TA 305, it can be configured to monitor input at the TA 305. Should input at the TA 305 exceed a predetermined limitation, the SM 301 can open the SR 313, disconnecting the TA 305 PA from the DUT 331, and interrupting DUT 331 testing. The SM 301 can keep the SR 313, configured to couple the TA 305 PB with the DUT 331, closed so that TA 305 testing of the DUT 333 can continue without interruption. Similarly, the SM 301 can control operation of the safety relays SR 317, 319 that couple power channels PA, PB, of the TA 307 and the DUT 335,337 respectively; the SR 321, 323 that provide power connections between the TA 309 and the DUT 339, 341 respectively; and the SR 325, 327 that provide power connections between the TA 311 and the DUT 343, 345 respectively. The SM 301 can be configured to monitor testing by the TAs 305, 307,309 and 311 simultaneously as they implement various test profiles for the various DUTs 331, 333, 335, 337, 339, 341, 343 and 345. The SM 301 can be configured to determine whether input at the TA 305, 307, 309, or 311 violates any predetermined test limitation. The SM 301 can be configured to disconnect a power channel by opening a safety relay in response to determining that a test constraint violation has occurred.

An SM 302 can be configured to monitor testing by TA 306, TA 308, TA 310 and TA 312, each of which can be configured with two power channels PA, PB, that can be used to charge or discharge a device under test, in this example DUTs 330, 332, 334, 336, 338, 340, 342 and 344 respectively. The SM 302 can be configured to control a power connection between the identified TAs and DUTs. By way of example, the SM 302 can be configured to control a safety relay SR 314 that enables a power connection between the TA 306 and the DUT 330, and to control a safety relay SR 316 that provides a power connection between the TA 306 and the DUT 332. The SM 302 can also be configured to monitor input at the TA 306. Should input at the TA 306 from the DUT 330 exceed a predetermined limitation, the SM 302 can open the SR 314, disconnecting the TA 306 from the DUT 330, and interrupting testing of the DUT 330. Since the SR 314 is configured to couple the TA 306 with the DUT 330, TA 306 testing of the DUT 332 can continue without interruption. Similarly, the SM 302 can control operation of the safety relays SR 318, 320 that provide power connections between the TA 308 and the DUT 334,336 respectively; the SR 322, 324 that provide power connections between the TA 310 and the DUT 338, 340 respectively; and the SR 326, 328 that provide power connections between the TA 312 and the DUT 342, 344 respectively. The SM 302 can be configured to monitor testing by the TAs 306, 308,310 and 312 simultaneously as they implement various test profiles for the various DUTs 330, 332, 334, 336, 338, 340, 342 and 344. The SM 302 can be configured to determine whether input at the TA 306, 307, 309, or 311 violates any predetermined test limitation. The SM 302 can be configured to disconnect a power channel by opening a safety relay in response to determining that a test constraint violation has occurred.

The SM 301 and SM 302 can perform a mutual verification process to check the integrity of each while monitoring testing of the TAs 305-312. Interlocking of the SM 301 and the SM 302 enables either to interrupt a testing process monitored by the other (remote) supervisor monitor should a fault be detected. For example, should the SM 301 determine that the SM 302 is not functioning properly the SM 301 can stop all testing performed by the TAs 306, 308, 310 and/or 312. The SM 301 can also stop testing it is monitoring, namely testing conducted by the TAs 305, 307, 309 and 311 in response to detecting a fault at the SM 302.

Figure 4:
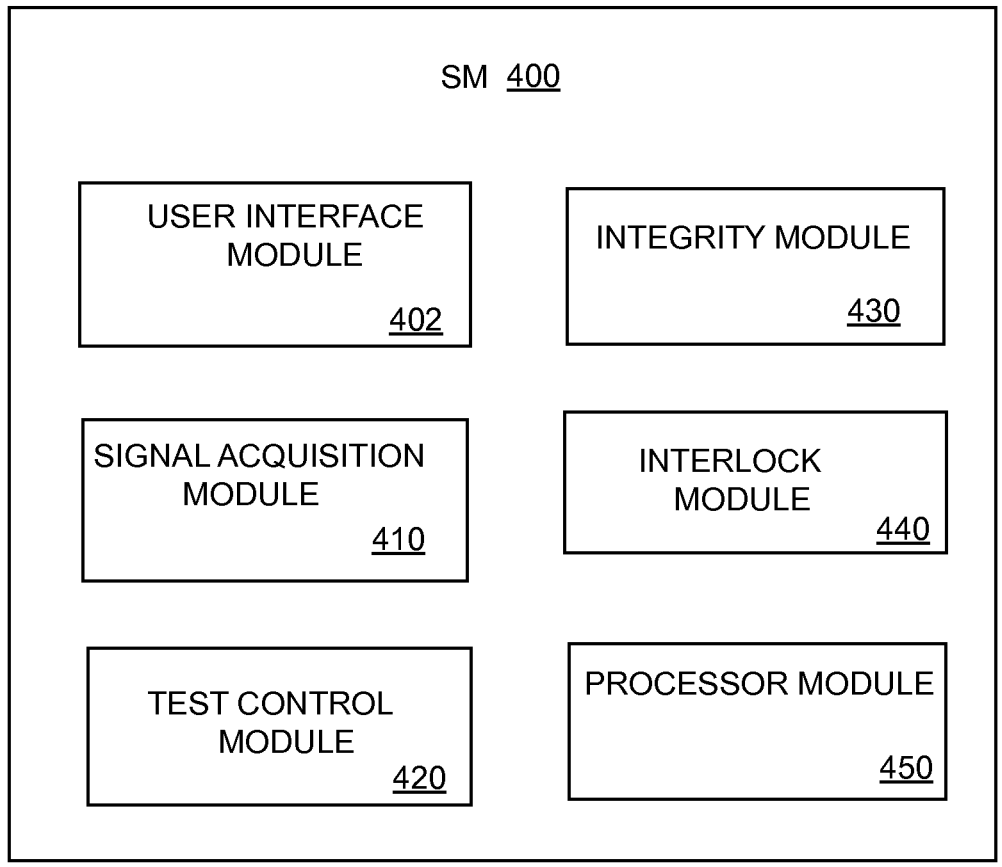

FIG. 4 depicts an SM 400 having a user interface module 402, a signal acquisition module (SAM) 410, a test control module (TCM) 420, an integrity module 430, and an interlock module 440. The SM 400 can further include a processor module 450. The user interface module 402, which can include hardware, software, firmware and/or some combination thereof, can be configured to receive input from an operator such as, but not limited to, the number of tests to be conducted, the selection and allocation of testing apparatus resources, identification of devices to be tested, and constraints/limitations for each test monitored by the SM 400. By way of example, the user interface module 402 can comprise graphical programming software configured for measurement and test systems, such as, but not limited to, National Instruments® LabView Virtual Instruments (VI) software. In addition, the user interface module 402 can include one or more user input/interface devices such as a display monitor configured to display a user interface screen, a keypad, a joystick or other interactive device. The user interface module 402 can be configured to cooperate with the processor module 450 for software execution, or can be configured to include a special-purpose processor for executing software. The user interface module 402 can further comprise a memory for storing test constraints, log files, and/or other data. In an exemplary embodiment, the user interface module 402 can be configured to receive input for multiple tests of multiple devices by multiple testing apparatus. Tests monitored by the SM 400 can be conducted sequentially or simultaneously. The user interface module 402 can be configured to provide a test report to a user, such as, but not limited to a visual report on a display screen, a print out report, a text message to a smart phone or other electronic communication device, or an audio report. In an example embodiment, a trigger event that causes a testing procedure to be interrupted can prompt generation of a report explaining the basis for the test interruption.

Figure 5:
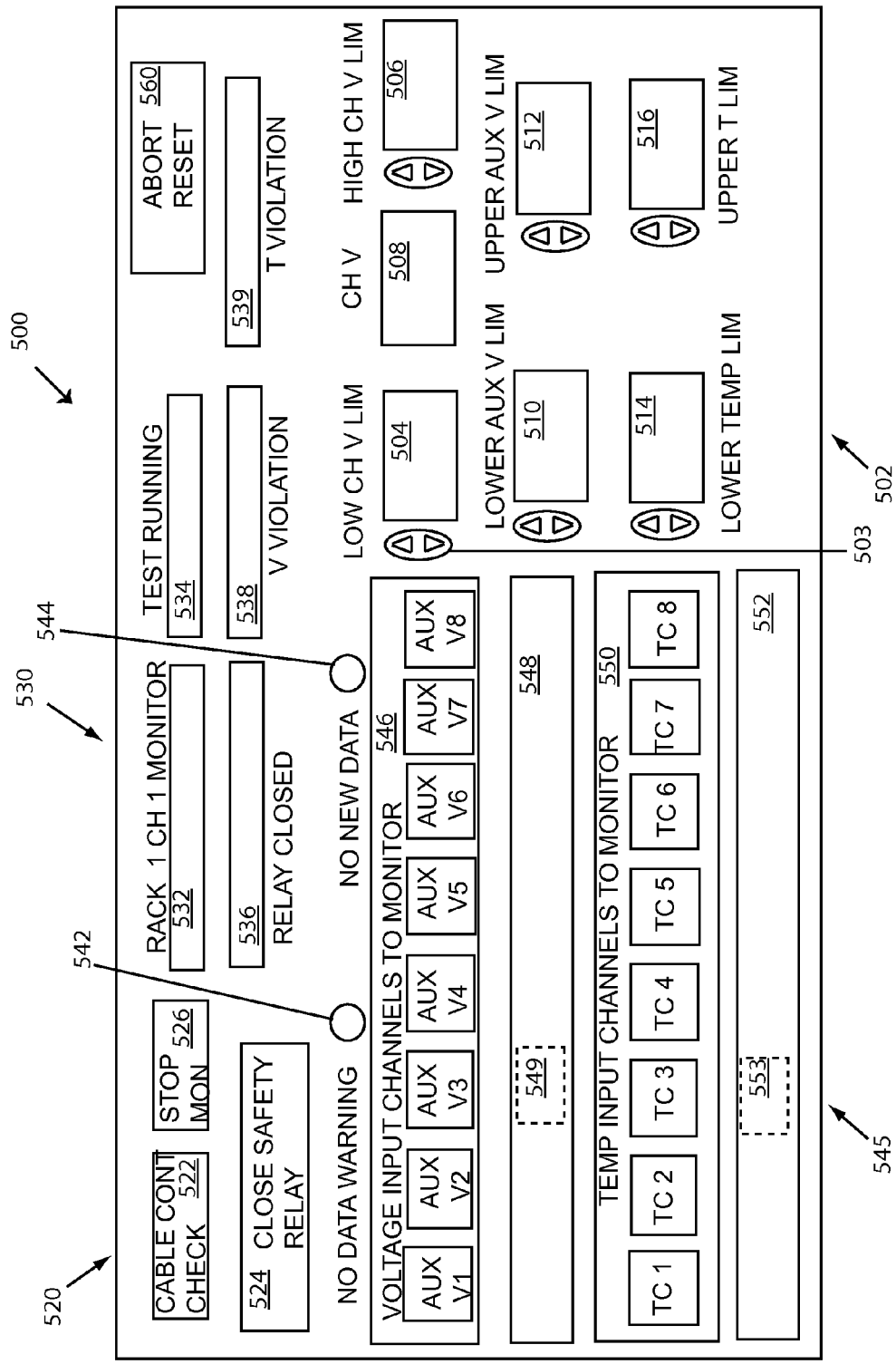

FIG. 5 shows an example supervisor monitoring system (SMS) graphical user interface (gui) 500 that can be provided by the user interface module 402. In an example embodiment, the user interface 500 is displayed on a display screen associated with the user interface module 402. An SMS user interface can be customized to reflect resources provided by a particular testing apparatus. For example, the SMS user interface 500 can be configured for use when supervising testing by a testing apparatus embodied as an Arbin Instruments™ battery cycler such as the Hybrid Vehicle Testing System (HEVBT) model or the Battery Testing System (BT2000), having two power channels, and 16 inputs that include eight thermocouple channels and eight analog channels that can be shared between the two power channels. The example SMS user interface 500 includes a test parameter section 502, a control section 520, an indicator section 530 (that also identifies test apparatus and channel), and a channel selection portion 545. The test parameter section 502 can be configured to receive test constraints for a particular test conducted by a testing apparatus (identified in the indicator section 530) and monitored by the SM 400. A power channel lower voltage limit can be designated at portion 504, for example by using a selector 503 that allows an operator to increment or decrement values within a range of possible values. Similarly, a high voltage limit can be designated at a portion 506. Actual channel voltage can be displayed at portion 508. Test limits can also be set for the input channels at the testing apparatus. A "Voltage Input Channels to Monitor" portion 546 can be configured to enable an operator to select one or more auxiliary voltage channels to be monitored for a particular test. Here auxiliary channels are identified as AUX V1-AUX V8. AUX V3 can be used in a test of a DUT using power channel 1 of the Rack 1 (channel and apparatus identified in indicator section 530). Auxiliary voltage channel V3 is shown as selected by indicator 549. A lower limit for the AUX V3 voltage can be designated at portion 510, using a selector 503, and likewise an upper voltage limit for channel AUX V3 can be designated at portion 512. In like manner, at a "Temperature Input Channels to Monitor" portion 550, one or more temperature input channels TC1-TC8, can be selected for monitoring during a test using the Rack 1 power channel 1. For example, temperature channel TC3 can be selected as shown by indicator 553. For each temperature channel selected, a lower temperature limit can be designated at portion 514, for example by using a selector 503, and an upper temperature limit can be designated at portion 516.

The operator control portion 520 can be configured to enable an operator to perform certain operations. For example, the operator control portion 520 can include a "Cable Continuity Check" portion 522. Selection of this option, perhaps by clicking on the portion 522, can prompt an SM to enable a power connection between a TA power channel and a DUT for a predetermined period of time so that an operator can check wiring configurations between the TA and the DUT. Upon expiration of the predetermined time period, the connection can be disabled. For example, a safety relay can be closed for a predetermined period of time, then reopened. If an operator requires additional time to complete a cable continuity check he can select the option again until satisfied that wiring between the TA and the DUT has been done properly. In an example embodiment, an SM can be configured to close a safety relay for a continuity check only when a TA is not attempting to run a test profile. A "Stop Monitoring" option 526 is configured to allow an operator to stop the SM 400 monitoring of a test performed at a particular testing apparatus channel, in this case channel 1 of the Rack 1. A "Close Safety Relay" option 524 enables an operator to close a safety relay that provides a power connection between the Rack 1 Power Channel 1 and a DUT it is configured to test, thereby enabling the test to begin.

The indicator section 530 can include an indicator bar 532 that, by way of example but not limitation, can appear intermittently illuminated, for example blinking at a one second rate, when the testing apparatus identified in an apparatus identification portion 531 is being monitored by the SM 400. An indicator bar 534 can be configured to indicate that a test profile is currently being run or attempted to run by the identified testing apparatus. A "contactor closed" indicator 536 can be configured to indicate when a power channel connection between a testing apparatus and a DUT is closed. For example, in response to an operator clicking the "close safety contactor" option 524, the indicator 536 can inform an operator that the safety relay has been closed successfully. A voltage violation indicator 538 can appear illuminated when a voltage at either a primary or auxiliary channel violates the upper or lower limitation input at the parameter section 502. Similarly, a temperature violation indicator 539 can appear illuminated when a temperature input at a testing apparatus violates an upper or lower test constraint designated at the parameter section 502. A "no data warning" indicator 542, and a "no new data" indicator 544 can also be provided at the user interface 500. These indicators can be configured to indicate the integrity of the SM itself. For example, a user program associated with each user interface can be configured to check whether data it is receiving is being updated. For example, a local counter associated with a user interface can be compared with a global counter to determine whether data is being updated. In an example embodiment, in response to a determination that information is not being updated, an SM can disable the connection between the TA power channel and DUT associated with the particular test associated with the user interface 500.

In an example embodiment, when a temperature or voltage violation occurs, testing of the particular DUT associated with the violation can be stopped by the SM 400. Should an operator desire to resume testing after a test has been aborted, he can select an abort reset option 560. In an exemplary embodiment, the abort reset cannot be performed if a TA is still trying to run a profile script even though the safety relay has been opened. This forces an operator to also stop the TA profile script and reset the TA prior to attempting to resume testing on the TA channel.

A user interface module can be configured to provide a separate user interface 500 for each test monitored by an SM. As separate tests can be conducted simultaneously, user interfaces for multiple tests can be displayed simultaneously. In addition to the user interface 500, a user interface module can be configured to provide additional displays and screens associated with the various tests being monitored.

Referring back to FIG. 4, the signal acquisition module (SAM) 410 can be configured to monitor input at a testing apparatus. The SAM 410 can comprise hardware, software, firmware or some combination thereof, and be configured to receive the same analog input received at a testing apparatus, for example, an overlay harness coupled to the supervisor monitor 400 can be connected in parallel at a testing apparatus so that signals from sensors at a DUT can be provided to the SAM 410. As discussed previously herein, in an exemplary embodiment, a testing apparatus is in the form of an Arbin Instruments™ battery cycler such as the Hybrid Vehicle Testing System (HEVBT) model or the Battery Testing System (BT2000) model, and is configured with independent power channels, potentiostatic/galvanostatic functionality and dynamic data acquisition capability. For example the testing apparatus can be configured with thermistors or thermocouples for sensing temperatures at electrochemical cells.

Figure 6:
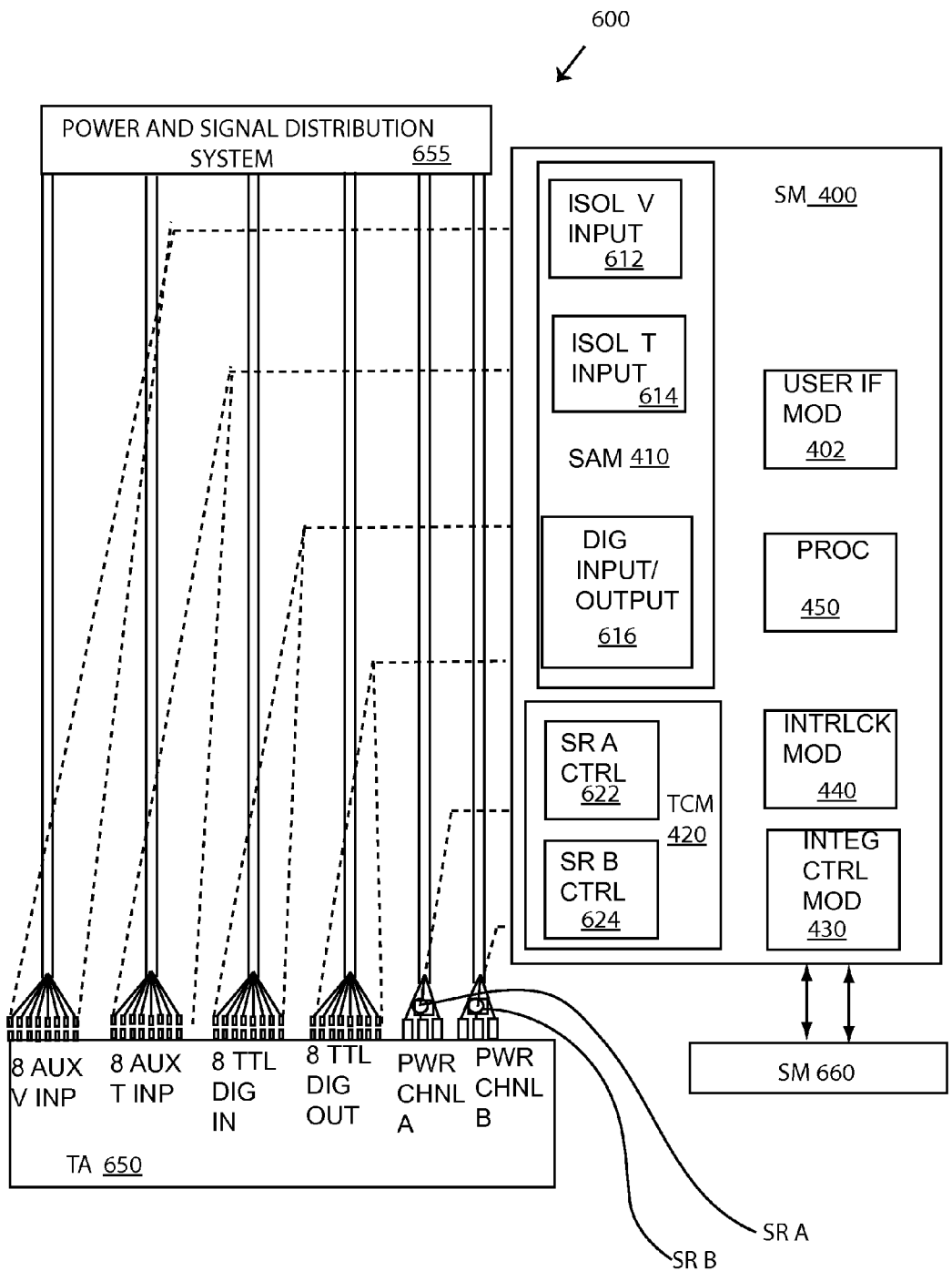
FIG. 6 depicts an example embodiment of a supervisor monitor.

FIG. 6 shows an example 600 in which the SM 400 is interfaced with a TA 650. A power and signal distribution system 655 can be configured to couple the TA 650 with one or more DUTs to be tested by the TA 650. The SAM 410 can be configured with an isolated voltage input submodule 612 configured to receive analog voltage signals provided at the TA 650 during a test. An isolated temperature input submodule 614 can be configured to receive temperature signals provided at the TA 650. In an example embodiment, the TA 650 is embodied as an Arbin™ Instruments HEVBT cycler, and the SAM 410 can be configured to receive 8 auxiliary voltage input signals and 8 temperature input signals.

The SM 400 can include a digital input/output submodule 616 configured for digital input and/or output signals between the SM 400 and the TA 650. By way of example, but not limitation, digital signals can be used between the TA 650 and SM 400 to indicate the commencement or completion of a test by the testing apparatus. In addition, digital signals can be used for communication between the SM 400 and a remote SM 660 with which it is cooperating to supervise a test performed by the TA 650.

Referring back to FIG. 4, the test control module (TCM) 420 can be configured to control testing monitored by the SM 400, for example, the TCM 420 can comprise hardware, software, firmware or some combination thereof, and be configured to interrupt device testing by a testing apparatus in response to a test trigger event, such as a violation of a predetermined test constraint. In an example embodiment, the TCM 420 is configured to control a power connection between a testing device and a testing apparatus. By way of example, but not limitation, the TCM 420 can be configured to control a safety relay that couples a power channel of a battery testing apparatus to a battery cell under test. In an exemplary embodiment, the TCM 420 can be configured to control a plurality of safety relays that can couple a plurality of battery cyclers to a plurality of battery cells. The TCM 420 can be configured to cooperate with the processor module 450 to control one or more safety relays. Alternatively, some or all processing for controlling a safety relay can be performed by a TCM 420 special-purpose processor.

By way of example, but not limitation, the TCM 420 can be configured to control a safety relay in the form of a Kilovac relay manufactured by TE Connectivity®. The Kilovac relay can be configured with a set of contacts controlled by a contactor coil. Energizing a coil can close the set of contacts, completing a connection between a power channel of a testing apparatus and a DUT; de-energizing a coil can release the contacts, de-coupling the power connection. The TCM 420 can include a safety relay (SR) A control submodule 622 and a SR B control submodule 624. In an exemplary embodiment, the submodule 622 can be configured to energize a coil associated with contacts for an SR A, and the submodule 524 can be configured to energize a contactor coil associated with contacts for an SR B so that testing can be performed, and de-energize the respective coils when a test is completed, or in response to a test trigger event.

Figure 7:
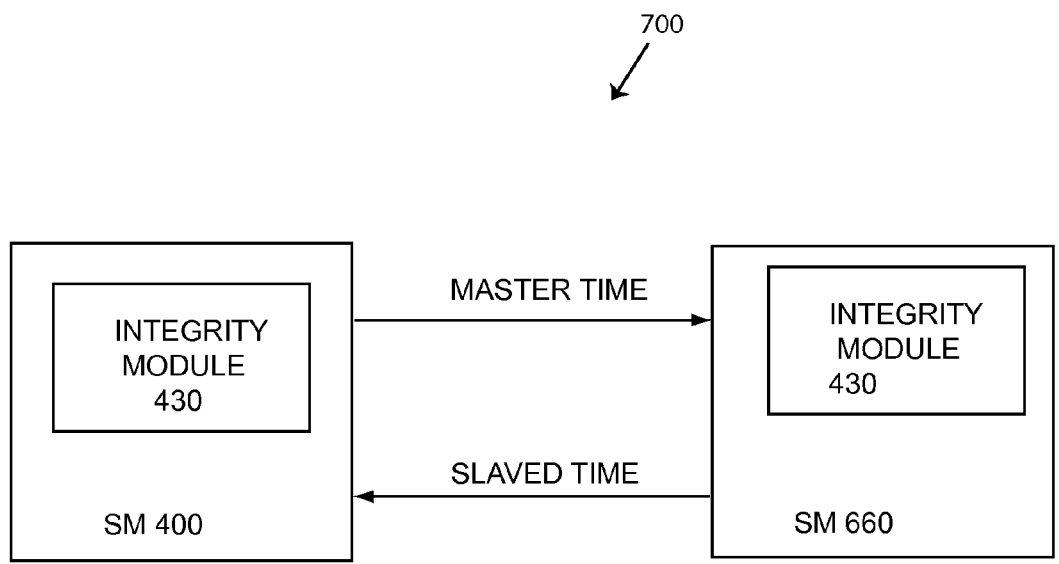
FIG. 7 shows an example embodiment.

The integrity module 430, which can comprise hardware, software, firmware or some combination thereof, can be configured to monitor the integrity of a remote SM, for example the remote SM 660 shown in FIG. 6, that is cooperating with the SM 400 to form an autonomous supervisory system. In an example embodiment, the integrity module 430 is configured to perform an integrity check by exchanging time of day information with the remote SM. For example, referring to an exemplary system 700 depicted in FIG. 7, the integrity module 430 at the SM 400 can be configured to send a time of day (master time) to an integrity module 430 at the remote SM 660, which can be configured to respond by sending a reply that includes time received (slaved time) to the SM 400, for example back to the integrity module 430. A time interval between the master and slaved times that exceeds a predetermined interval, can be recognized as a fault at the SM 660. Similarly, the integrity module 430 at the SM 660 can be configured to determine whether a time period between sending a slaved time and receiving a master time exceeds a predetermined period to determine whether a fault has occurred at the SM 400. A fault at either the SM 400 or the SM 660 can be a trigger event that causes the system 700 to terminate all testing it is supervising, i.e. testing by any TA coupled to the SM 400 as well as any testing by any TA coupled to the SM 660. The integrity module 430 at the SM 400 can cooperate with the integrity module 430 at the SM 660 to verify that both the SM 400 and the SM 660 are functioning properly throughout a battery testing process supervised by the system 700.

Referring again to FIG. 4, the interlock module 440, which can comprise hardware, software, firmware or some combination thereof, can be configured to enable the SM 400 to terminate testing monitored by a remote SM in response to a system trigger event, such as detection of a fault at an SM, or a system abort command by an operator. In an example embodiment, the interlock module 440 can comprise one or more power relays configured to couple a safety relay power supply for a remote SM with the remote SM. By controlling the power relays, the interlock module 440 can control power to safety relays coupled to the remote SM, and thereby control operation of power channels at a TA monitored by the remote SM. In the event that an SM fault is detected, power to remote safety relays can be cut off, opening remote safety relays and disabling the power channels of a TA coupled to the remote SM.

Figure 8:
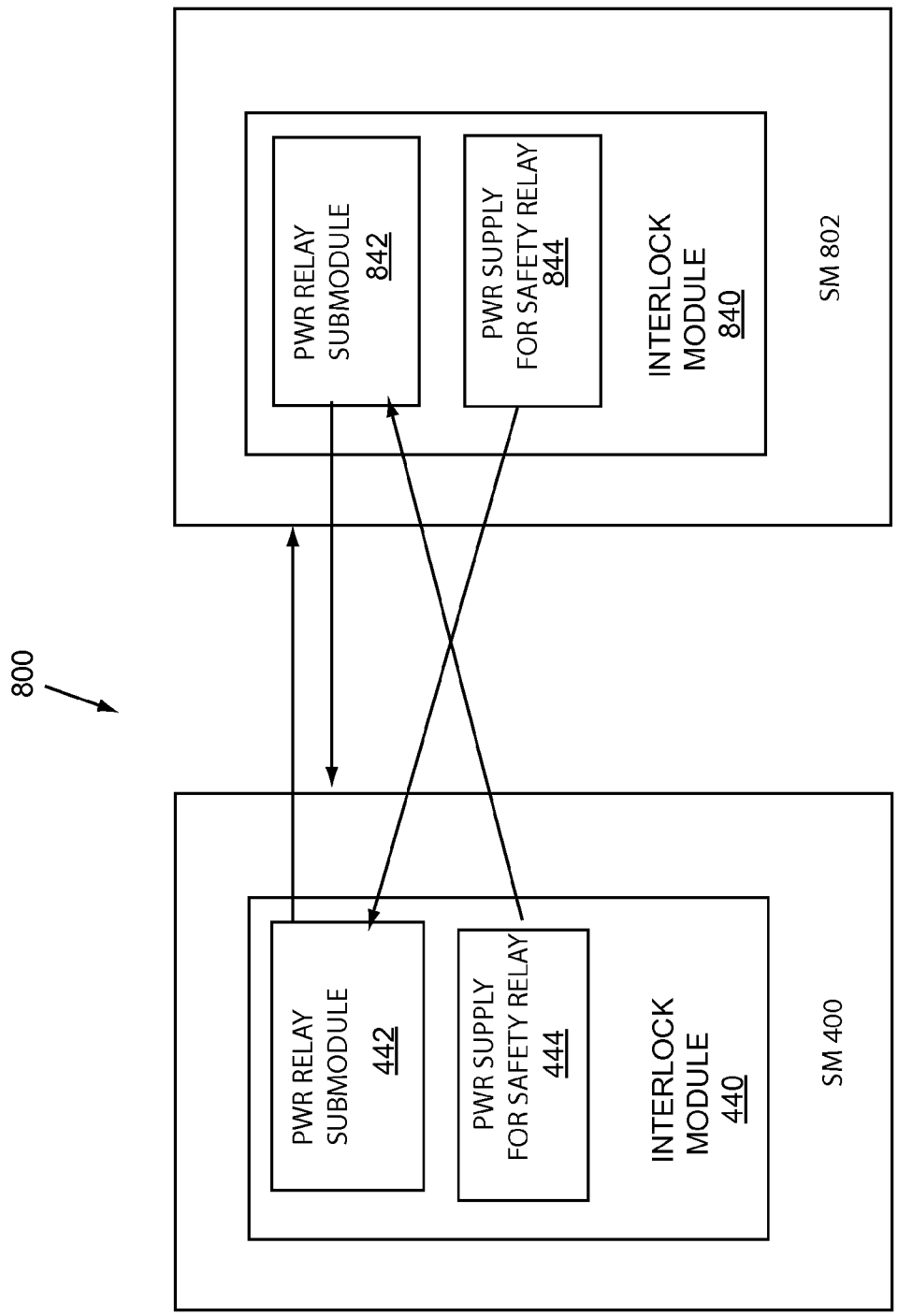
FIG. 8 shows an example embodiment.

FIG. 8 shows an example configuration 800 of interlocked SMs 400 and 802 that cooperate to provide an SMS. By way of example, but not limitation, the interlock module 440 at the SM 400 can include a power relay submodule 442 which can comprise one or more low power relays that can couple a safety relay power supply for a remote SM (in this case power supply 844 at the SM 802) with the SM 802, for example with a TCM (not shown) at the SM 802. The interlock module 440 can be configured to close the low power relays during normal operation, and open the low power relays in response to a trigger event, such as an SM fault. The interlock module 440 can be configured to cooperate with the processor module 450 and the integrity module 430 to open power relays at the power relay submodule 442 in response to a trigger event.

The interlock module 440 at the SM 400 can further include a power supply 444 that can be used to power safety relays controlled by the SM 400. For example, referring to FIG. 6, the power supply 444 can be configured to provide power to the TCM 420 for use by SR A submodule 622 and SR B submodule 624 to energize contactor coils for safety relays that couple power channels PA, PB of the TA 650 to a DUT via the power and signal distribution system 655. As shown in FIG. 8, the power supply 444 at the SM 400 can be coupled to a power relay submodule 842 at the SM 802. By controlling one or power relays at the submodule 842, the SM 802 can control delivery of power from the power supply 444 at the SM 400 to safety relays controlled by the SM 400, thereby controlling testing performed at a TA monitored by the SM 400. Interlocking of two SMs that cooperate to provide an autonomous supervisory system can provide a failsafe system that automatically shuts itself down should either SM malfunction.

The example SM 400 can include a processor module 450 that can comprise hardware, software and firmware and be configured to perform a variety of processing functions as required by the various modules and submodules of the SM 400. The processor module 450 can be configured to communicate with and/or control the various modules and execute any software and logic that their operation may necessitate. The processor module 450 can be configured to determine whether analog input received at the SAM 410 violates a predetermined test constraint received at the user interface module 402. In response to a violation, the processor module 450 can be configured to signal the TCM 420 to de-energize a coil that closes safety relay contacts for a safety relay that couples a TA to a DUT having the out-of-range characteristics. As a further example, in response to a fault detected at a remote SM by the integrity module 430, the processor module 450 can be configured to signal the interlock module 440 to open power relays at the in power relay submodule 442.

While the example embodiment SM 400 includes the processor module 450, it can be understood that the processing functions it performs can alternatively be performed at the individual modules 402, 410, 420, 430, and 440, and further, that the said modules can be variably defined and combined so that a single module may be configured to perform the tasks of two or more modules of the example SM 400. In an example embodiment, NI LabView VI software can be used in conjunction with SM 400 hardware to implement the various functions and operations of the modules 402, 410, 420, 430, 440 and can be executed at the processor module 450 or at the said modules.

In an exemplary embodiment, the user interface module 402 can provide an individual LabVIEW User VI program for each test monitored by the SM. In an example embodiment, a LabVIEW User VI program can be configured to receive user predetermined test limitations, select resources to be monitored, check received input against predetermined limitations, display status to a user, log errors to text files and send relay open/close requests. The integrity module 430 can incorporate a Labview Watchdog Timer VI program to send time to a remote SM, receive time from a remote SM and update global variables with the latest times. A LabVIEW SCADA VI program can be used to collect analog data associated with one or more tests monitored by the SM 400, process relay open/close requests, process digital interlock input/output signals, process watchdog timer data, send current status to a user program at a user interface, and open and close safety relays associated with one or more power channels used to conduct the testing monitored by the SM 400. LabVIEW Global VI software can be used to store the most recent updates from the other modules, and can be used to link multiple LabVIEW VI programs used to monitor multiple tests at the SM 400.

Figure 9A:
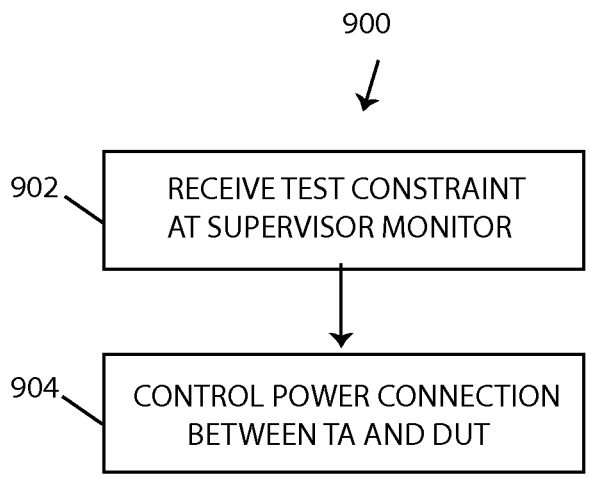
FIG. 9A shows an example method.

FIG. 9A shows an example method 900 that can be practiced at a supervisor monitoring system. At block 902, a predetermined test constraint can be received. For example, a user interface module, such as the user interface module 402, at the SM 101 can receive a test constraint, such as a minimum and/or maximum temperature and/or voltage limit from a user, for example via the interface screen 500. The test constraint can be stored at a memory, such as a memory at the processor module 450.

At block 904, a power connection between a testing apparatus and a DUT can be controlled. For example, a supervisor monitor system comprising the SM 101 and SM 102 can control the power connection 106 between the TA 104 and the DUT 108. A supervisor monitor system can close (enable) the PC 106 so that the TA 104 can test the DUT 108. A supervisor monitor system can open (disable) the PC 106 to interrupt testing or to disconnect the TA 104 from the DUT 108 in response to a trigger event.

Figure 9B:
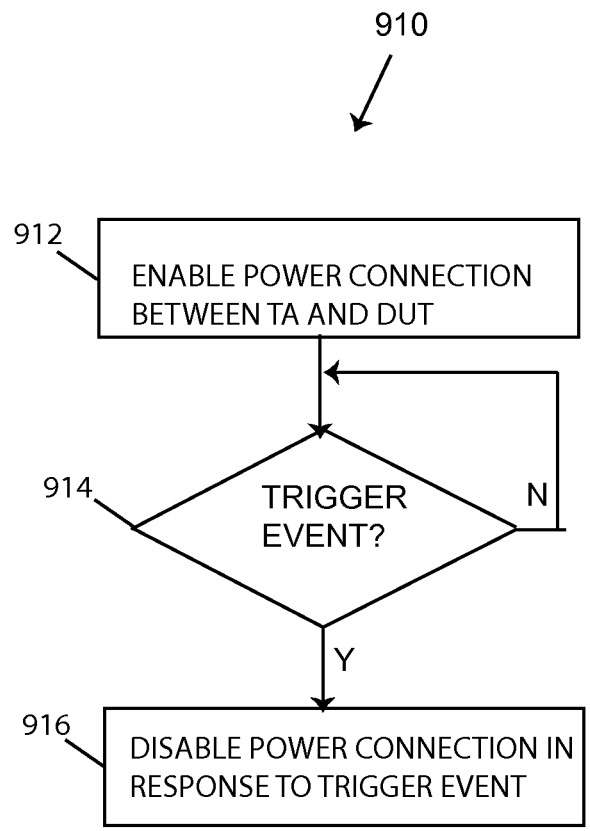
FIG. 9B shows an example method.

FIG. 9B depicts an example method 910 that can be practiced at a supervisor monitor to control a power connection between a testing apparatus and a device under test. The method 910 can be practiced at a supervisor monitor functioning as a primary SM, and can also be practiced at supervisor monitor functioning as a remote SM. However, as discussed below, implementation of the method can differ depending on whether an SM is functioning as the primary or remote SM. Considering first the case in which the method is practiced at an SM functioning as a primary SM, i.e. coupled to the TA conducting the test, at block 912 an SM can enable a power connection between a TA and a DUT. For example, the SM 201 can enable the PC 206 between the TA 204 and the DUT 208. In an example embodiment, the SM 201 can enable the power connection by closing a safety relay, SR A, that couples the TA 204 and DUT 208. For example, an SR A control submodule 622 at the SM 201 can energize a coil to close safety contactors at the SR A. By way of example, the SR A coil can be energized using power provided by a power supply 444 at an interlock module 440 of the SM 201.

At decision block 914 a determination can be made as to whether a trigger event has occurred. For example, the SM 201 can use analog and/ or digital input received at an SAM 410 to determine whether a trigger condition or event is present. By way of example, a trigger event can comprise analog input that violates a test constraint. If no trigger event has occurred, the method can continue with the power connection remaining enabled. For example, the SM 201 can continue to energize a coil of the SR A to maintain the power connection between the TA 104 and the DUT 108. However, in response to a trigger event, at block 916 the SM 201 can cease to energize the coil, thereby opening contacts at the SR A, opening the power connection 106 and decoupling the TA 104 and DUT 108.

When an SM is configured to function as a remote SM for a test monitored at a primary SM, at block 912 it can enable a power connection controlled by a primary SM by closing a power relay that couples the primary SM with a power supply for the safety relays controlled at the primary SM. For example, referring to FIG. 3, the SM 301 can be configured with an interlock module 440 and a TCM 420; and the SM 302 can be configured with an interlock module 840. The SM 302 can close a power relay at the power relay submodule 842 so that power can flow from the safety relay power supply 444 at the SM 301 through the power relay at the submodule 842 at the SM 302 back to the SM 301 so that the SR 313 can be closed by the TCM 420 at the SM 301 to couple the TA 305 and the DUT 331.

At block 914, the SM 302 can use input from the SM 301 to determine whether a trigger condition is present. For example, an integrity module 420 at the SM 302 can receive a master time signal from the SM 301 that can be used to determine whether the SM 301 is functioning properly. If a fault or malfunction is detected, at block 916 the SM 302 can open a power relay at the power relay submodule 842, cutting off power from the power supply 444 and preventing the SM 301 from closing the SR 313, thereby decoupling the DUT 331 from the power channel PA of the TA 305.

Figure 10:
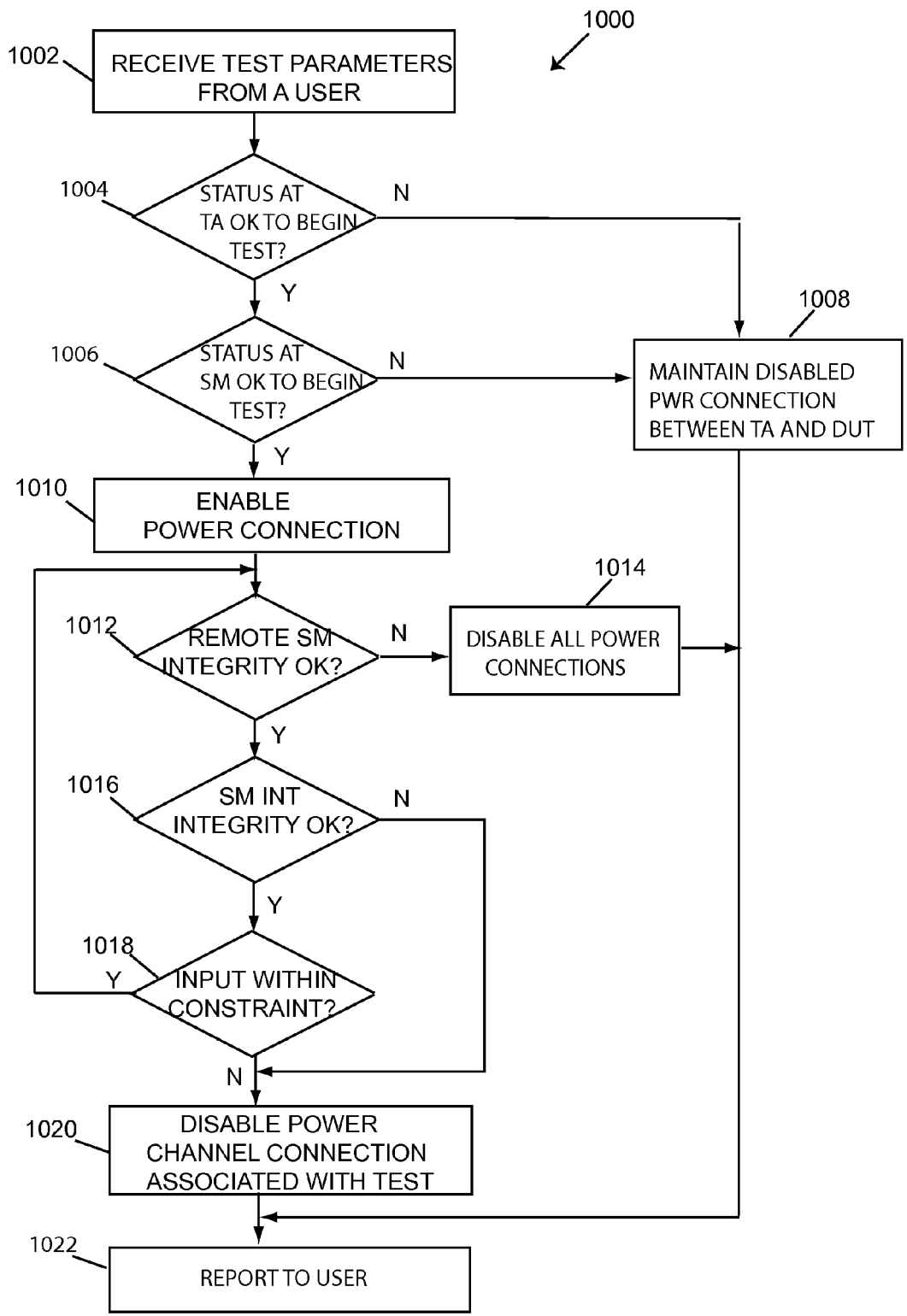
FIG. 10A shows an example method.
FIG. 10B shows an example method.
FIG. 10C shows an example method.
Figure 10:
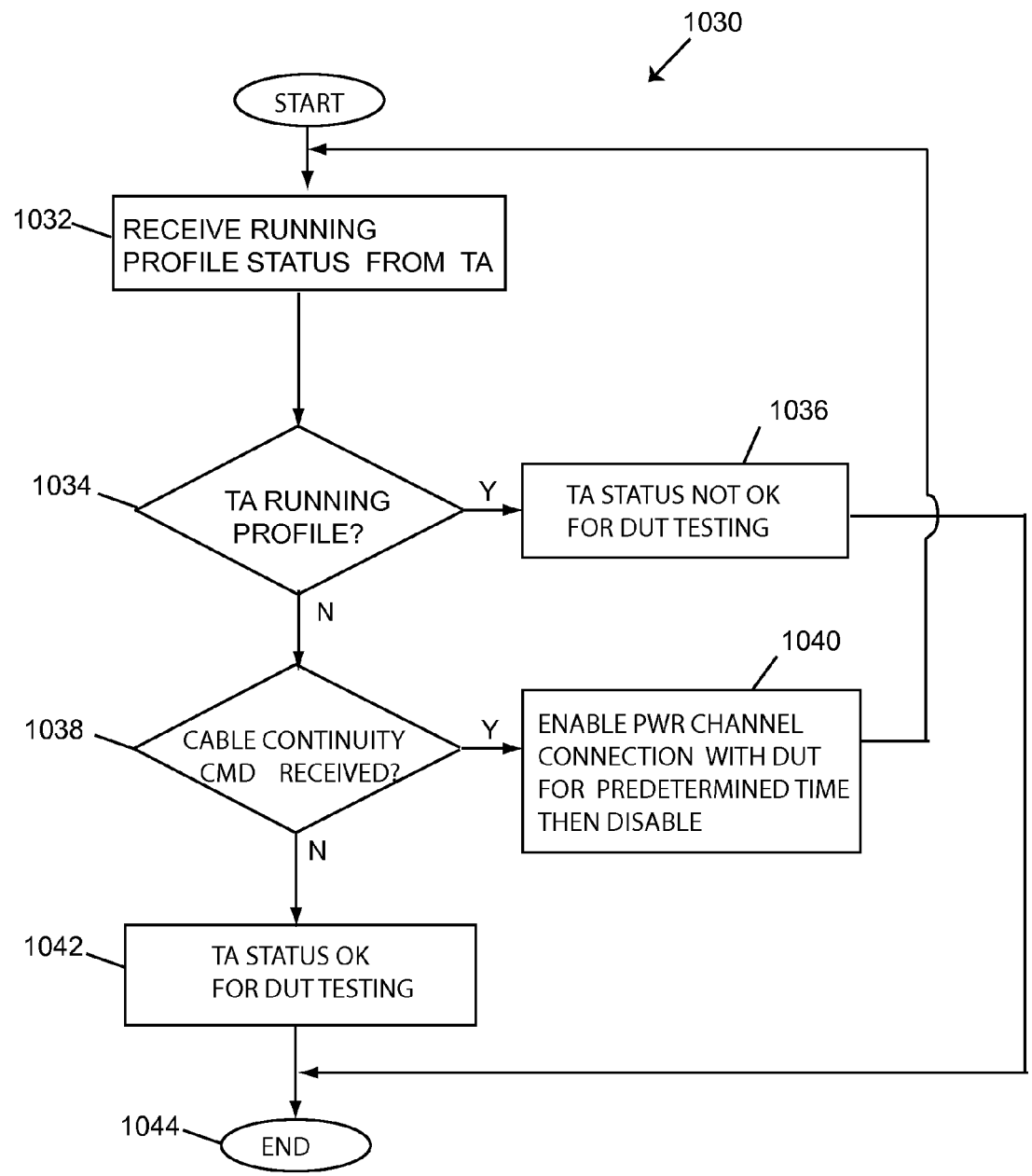

FIG. 10 shows a method 1000 that can be practiced at a supervisor monitor. By way of example, a TA can be embodied as a battery cycler and a DUT can be embodied as a battery cell. At block 1002, test input can be received from a user. For example, the interface module 402 can receive operator input via the interface 500 regarding allocation of resources, cell characteristics to monitor, test constraints and limitations, etc. for a test using power channel 1 of rack (or cycler) 1. Because an SM can monitor testing by a plurality of multichannel battery cyclers simultaneously, an interface 500 can be associated with a particular channel of a battery cycler. For example, a user interface can identify a particular cycler rack and power channel as shown in FIG. 5. By way of example, the SM 301 can receive user input via 8 separate user interfaces to receive test constraints for testing of the DUTs 331, 333, 335, 337, 339, 341, 343 and 345 by the two power channels of the TAs 305, 307, 309 and 311 respectively.

At block 1004 a determination can be made as to whether a TA is ready to begin testing on a particular power channel. For example, an SM can be configured to confirm that certain conditions at a TA are satisfied prior to enabling a power connection between the TA and a DUT. FIG. 10B shows an example method 1030 of determining whether conditions at a TA satisfy SM requirements for testing. At block 1032 an SM can receive a running status from a TA. For example, input from the TA 650 can be received SAM 410. At block 1034 a determination can be made as to whether the TA 650 is currently running or attempting to run a test profile at the particular power channel. For example, the processing module 450 can use input received at the SAM 410 to make that determination. If a TA is running or attempting to run a test profile using that particular power channel, then, as shown at block 1036, the resulting determination is that the TA status does not satisfy the requisite conditions for initiating a DUT test. By way of example, the indicator 534 can be illuminated to indicate that a TA is running or attempting to run a test profile.

If the TA is not running a test profile, an operator can perform a cable continuity check. At decision block 1038, a determination can be made whether an operator has input a cable continuity command, for example by selecting the command 522 at the interface 500. If so, then at block 1040, an SM can close, for a predetermined time period, safety relays that couple a TA to a DUT, so that an operator or external device can check wiring connections between a TA and a DUT. At the end of the predetermined time period the relays can be opened again. In an exemplary embodiment, the continuity check can only be performed if a TA is not running or attempting to run a test profile. If the TA is not running or attempting to run a test profile, and a cable continuity check is not currently being performed, then the determination can be made at block 1042 that the TA status is satisfactory for initiating DUT testing.

Figure 10C:
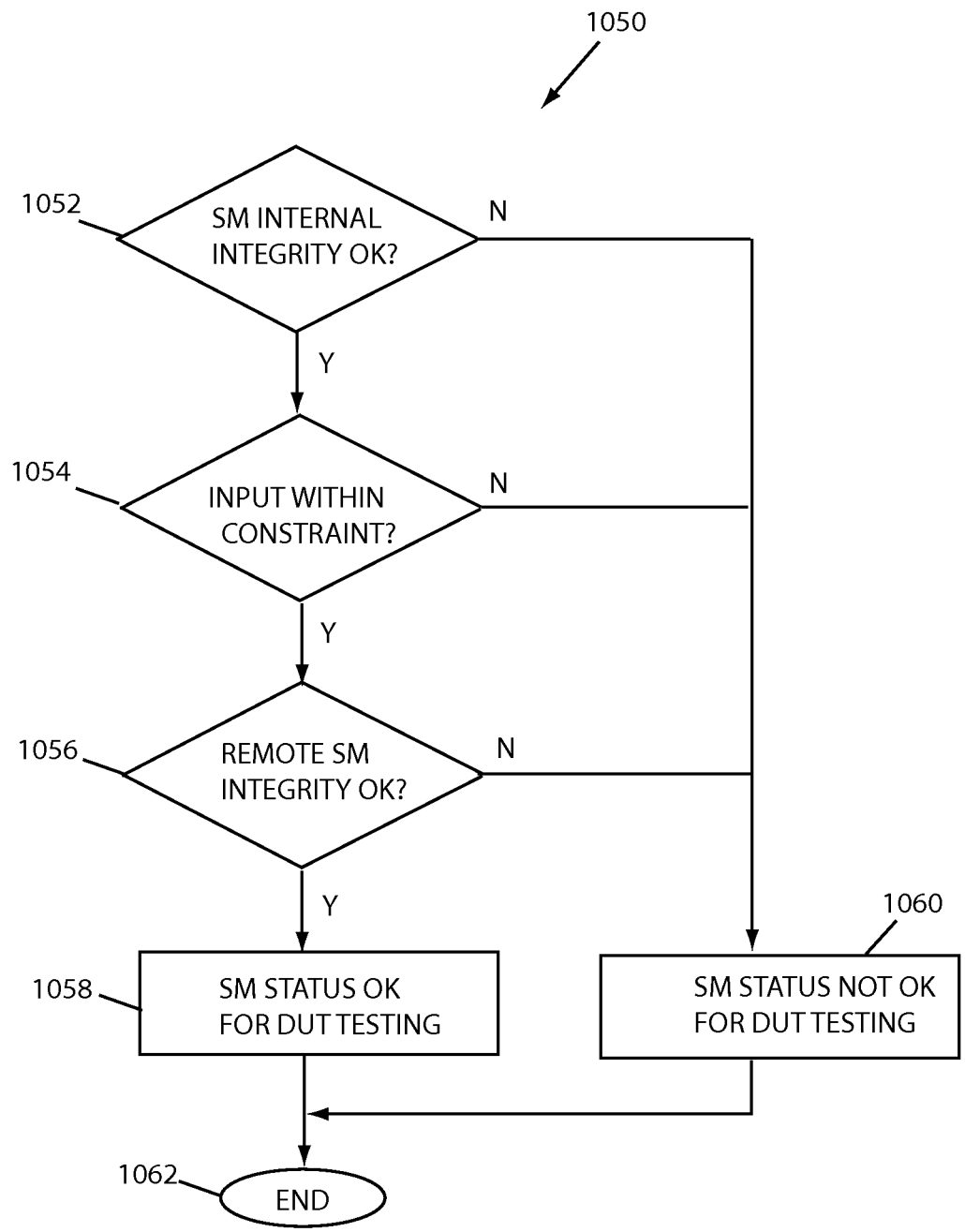

Referring back to FIG. 10A, the method 1000 can continue at decision block 1006 where a determination can be made as to whether conditions at an SM satisfy predetermined requirements for beginning a test. FIG. 10C shows an example method 1050, for example a subroutine, for determining whether conditions at an SM are satisfactory for initiating DUT testing. At block 1052, a determination can be made as to whether internal SM integrity is satisfactory. In an example embodiment, a check can be made as to whether data received at the SM user interface module 402 is being updated properly. For example, counters can be used to mark updates of data from the SAM 420. The counters can be stored in the global data variables. Each user interface associated with a power channel of a TA monitored by an SM can be configured to update its count to the global count on a regular basis. If a local user interface counter is 0 (a default value), the user interface can be configured to deny an operator request to close a safety relay. Accordingly, the determination can be made at block 1060 that the SM is not ready to initiate DUT testing. Similarly, if the global count does not continue to increase when compared to the local interface count, it can be assumed that the SM is not operating properly, and the determination can be made at 1060 that testing conditions are not satisfied for monitoring DUT testing. In an example embodiment, the "No Data Warning" indicator 42 can be illuminated. However, if SM internal integrity is satisfactory, the method can continue to block 1054 where a decision can be made as to whether input at the SM is within constraints. For example, analog input at the SAM 410 can be checked. If cell conditions are not within the test limitations, the determination can be made at block 1060 that the SM is not in a state that would allow DUT testing to begin. If internal SM integrity is confirmed, and input is within user constraints, then at block 1056 a decision can be made as to whether the integrity of a remote SM coupled to the present SM is satisfactory. As discussed before, the integrity module 430 can be used to confirm remote SM integrity. If the remote SM status is not satisfactory, a determination can be made at block 1060 that current SM status is not okay for initiating DUT testing. However, if the remote SM is found to be operating properly, at block 1058 the determination can be made that SM status is satisfactory for initiating DUT testing. The SM status determination from method 1050 can be used by the method 1000. Referring back to FIG. 10A, if both TA status and SM status are satisfactory, then at block 1010, an SM can enable a power connection between a TA and a DUT so that DUT testing can begin. For example, the SM 201 can enable the PC 206 between the TA 204 and the DUT 208. In an example embodiment, while the battery cycler is testing the battery cell, the supervisor monitoring system can monitor input at the battery cycler and the state at each supervisor monitor to detect any trigger event that may occur. While an SM is monitoring one or more tests, it can continue to verify SMS integrity by checking the integrity of the remote SM with which it is cooperating to monitor testing, as well as its own internal integrity.

At decision block 1012 an integrity check of a remote SM can be performed. For example, an integrity module 430 at the SM 301 can send a time message to an integrity module 430 at the remote SM 302. If a reply is received at the SM 301 within a predetermined time period, the power connections between the TA 305 and the DUT 331 can remain enabled. A lack of timely reply can be considered a trigger event indicating a fault at the remote SM 302. Because a supervisor monitoring system of the invention is configured so that two supervisor monitors work in tandem to supervise testing by one or more testing apparatus, should an SM detect a fault at a remote SM with which it is cooperating, it can be configured to stop testing by the TA it is monitoring, as well as at the TAs the remote SM is monitoring. Accordingly, should the SM 301 detect a fault at the remote SM 302 at block 1012, then at block 1014 the SM 301 can disable all power connections monitored by the supervisor monitoring system comprising SM 301 and SM 302. For example, a TCM 420 at the SM 301 can open the safety relays SR 313, 315, 317, 319, 321, 323, 325 and 327 to stop testing performed by the TAs 305, 307, 309 and 311 monitored by the SM 301. In addition, an interlock module 440 at the SM 301 can open the power relays at its remote SM relay submodule 834 to disconnect a relay power supply 832 at the SM 302 from the SM 302, preventing the SM 302 from closing the safety relays SR 314, SR 316, SR 318, SR 320, SR 322, SR 324, SR 326 and SR 328 it is configured to control. As a result, power connections between the TA 306, TA 308, TA 310, TA 312 and the DUTs 330, 332, 334, 336, 338, 340, 342 and 344 are disabled so that testing is stopped. At block 1018 a report indicating that testing was stopped can be provided to a user.

At block 1016, a decision can be made regarding SM internal integrity. As described above in the context of method 1050, global and local interface counters can be checked to verify that data is being updated properly. If it is determined that an SM is not functioning properly, then at block 1020 the power connection associated with the particular test and user interface can be disabled. For example, if a counter at the user interface associated with testing of the DUT 331 does not show the proper increases, or if a global counter does not continue to increase with respect to a local interface counter, then the SM 301 can be configured to open the safety relay 313, thereby interrupting DUT 331 testing by the TA 305.

In addition to confirming SMS integrity during a monitoring process, an SM can determine whether input conforms with user designated test constraints. At decision block 1018, input at a battery cycler can be compared to predetermined test constraints to determine whether input is within constraints or violates constraints. For example, battery cell voltage and temperature signals input at the battery cycler 305 can be detected by an overlay harness and provided to the SM 301. For example, analog temperature signals can be received at an "isolated temperature input" submodule 614 at a SAM 410 at the SM 301, and analog voltage signals can be received at a "isolated voltage input" submodule 612. A processor module 450 at the SM 301 can compare the voltage and temperature to test constraints designated by an operator at block 1002. If the input is within the bounds set by the test constraints, the SR 313 can remain closed so that battery cell testing can continue. However, should the input violate a predetermined test constraint, constituting a trigger event or condition, at block 1020 the power connection can be disabled. For example, a TCM 420 at the SM 301 can open the safety relay 313, interrupting testing of the battery cell 331 by the battery cycler 305. At block 1022, a report can be provided to the user, for example a message can be displayed at a display screen of the user interface module 402 giving notice that the test was interrupted. In addition, a test log can be maintained at the user interface module 402.

It is noted that testing of the cell 333 by the battery exerciser 305 can continue uninterrupted since the SM 301 can open the safety relay 313 while keeping the SR 315 closed. Likewise, testing at the TA 307, TA 309, and TA 311 can continue uninterrupted. In an exemplary embodiment, an SM can be configured to detect signal glitches. For example, should a violation of a predetermined test constraint be detected, causing a failure mode, a failure mode can be required to exist for a predetermined time period or number of iterations before testing is terminated by the SM. If the failure mode does not satisfy the predetermined conditions, the system can revert to a non-failure mode with power connections remaining enabled. Glitch detection can increase a system's immunity to noise spikes. So long as SMS integrity is confirmed, and input conforms to predetermined limits, testing monitored at the SM can continue uninterrupted until a test is completed. In an example embodiment, when a test is completed an operator can open the power connection between the TA and DUT, for example opening the SR 313 via a user interface. For example, an operator can select the command option "Stop Monitoring" 526. However, should an operator neglect to do so, when he disconnects test cables from the DUT 331, input at the SAM 410 will go outside normal monitor limits, which can cause the SM 301 to open the SR 313 to disable the power connection. A test report can be provided to a user at block 1020.

Thus, the present invention can provide a system that can autonomously supervise testing of multiple devices by multiple test apparatus, relieving human operators of the time-consuming task of monitoring test conditions, shortening the time required to complete testing and improving test results. A system can comprise two halves, a first supervisor monitor and a second supervisor monitor. Each can be configured to monitor testing performed by one or more testing apparatus, and each can be configured to verify the integrity of the other to provide a failsafe system that interrupts all testing when a fault is detected at either. A supervisor monitor can monitor input at a test apparatus such as a battery cycler, and compare the input to predetermined test constraints. When a constraint violation is detected, a supervisor monitor can interrupt testing by a power channel associated with the out-of-range input. If a supervisor monitor detects a fault at a remote supervisor monitor, it can disable power connections at testing apparatus coupled to the remote SM as well as disable power connections at testing apparatus to which it is coupled. Each supervisor monitor can be configured to couple to a plurality of multi-channeled testing apparatus to monitor testing by a plurality of devices. As required, illustrative embodiments have been disclosed herein, however the invention is not limited to the described embodiments. As will be appreciated by those skilled in the art, aspects of the invention can be variously embodied, for example, modules and programs described herein can be combined, rearranged and variously configured. Methods are not limited to the particular sequence described herein and may add, delete or combine various steps or operations. The invention encompasses all systems, apparatus and methods within the scope of the appended claims.

What is claimed:

1. A supervisor monitoring system, comprising:
   a first supervisor monitor (SM) configured to monitor testing of a first device by a first testing apparatus;
   a second SM configured to monitor integrity of said first SM; and
   wherein said system is configured to interrupt testing conducted by said first testing apparatus in response to a trigger event.

2. The system of claim 1, wherein said first SM is configured to monitor input at said first testing apparatus.

3. The system of claim 1, wherein said first SM is configured to control a power connection between said first testing apparatus and said first device.

4. The system of claim 1, wherein said second SM is configured to monitor testing of a second device by a second testing apparatus.

5. The system of claim 1, wherein said first SM is configured to be interlocked with said second SM so that said second SM can interrupt testing of said first device performed by said first testing apparatus in response to a trigger event.

6. The system of claim 1, wherein said trigger event comprises a fault at one of said first and second SMs.

7. The system of claim 1, wherein said trigger event comprises a violation of a predetermined test constraint associated with said testing.

8. The system of claim 1, wherein said first SM is configured to monitor testing conducted by a plurality of said testing apparatus.

9. A supervisor monitor, comprising:
   a user interface module configured to receive a predetermined test constraint from a user for testing performed by a testing apparatus on a device under test (DUT) coupled to said testing apparatus;
   a test control module (TCM) configured to control a power connection between said testing apparatus and said DUT;
   a signal acquisition module (SAM) configured to receive and monitor input at said testing apparatus provided by said DUT;
   an integrity module configured to verify integrity of a remote supervisor monitor;
   an interlock module configured to enable said supervisor monitor to interrupt testing monitored by said remote supervisor monitor;
   a processing module configured to compare said input with said predetermined test constraint; and
   wherein said supervisor monitor is configured to interrupt testing by said testing apparatus in response to a trigger event.

10. The supervisor monitor of claim 9, wherein said user interface module is configured to receive one or more said test constraints for one or more tests conducted by said testing apparatus and monitored by said supervisor monitor.

11. The supervisor monitor of claim 9, wherein said TCM is configured to control a safety relay configured to couple said testing apparatus and said DUT.

12. The supervisor monitor of claim 9, configured to monitor a plurality of tests simultaneously.

13. The supervisor monitor of claim 9, configured to monitor testing by a plurality of said testing apparatus simultaneously.

14. The supervisor monitor of claim 9, configured to interrupt testing monitored by a remote supervisor monitor in response to a trigger event.

15. The supervisor monitor of claim 9, wherein said modules comprise a non-transitory computer readable medium having logic instructions encoded thereon for performing operations and functions for which said modules are configured, said instructions configured for execution by a computer.

16. A method of electronic test supervision, comprising:
   receiving at a supervisor monitor apparatus of a supervisor monitoring system (SMS), a test constraint for testing performed by a testing apparatus on a device under test (DUT); and
   said SMS controlling a power connection between said testing apparatus and said DUT.

17. The method of claim 16, wherein said controlling a power connection comprises:
   enabling said power connection between said testing apparatus and said DUT;
   determining whether a trigger event has occurred; and
   disabling said power connection to interrupt said testing of said DUT in response to a trigger event.

18. The method of claim 17, wherein said trigger event comprises a violation of said test constraint.

19. The method of claim 17, wherein said trigger event comprises a fault at a remote supervisor monitor.

20. The method of claim 16, wherein said controlling a power connection comprises controlling a safety relay that couples said testing apparatus and said DUT.

21. The method of claim 16, wherein said controlling a power connection comprises controlling a power relay that couples a power supply to a safety relay.

* * * * *